United States Patent [19]
Kohda et al.

[11] Patent Number: 5,058,071
[45] Date of Patent: Oct. 15, 1991

[54] SEMICONDUCTOR MEMORY DEVICE HAVING MEANS FOR REPAIRING THE MEMORY DEVICE WITH RESPECT TO POSSIBLE DEFECTIVE MEMORY PORTIONS

[75] Inventors: Kenji Kohda; Yasuhiro Kouro; Hiroyasu Makihara; Tsuyoshi Toyama, all of Hyogo, Japan

[73] Assignee: Mitsubishi Denki Kabushiki Kaisha, Tokyo, Japan

[21] Appl. No.: 646,508

[22] Filed: Jan. 24, 1991

Related U.S. Application Data

[63] Continuation of Ser. No. 354,596, May 22, 1989, abandoned.

[30] Foreign Application Priority Data

Nov. 21, 1988 [JP] Japan ................. 63-293964

[51] Int. Cl.$^5$ ............................................. G11C 29/00
[52] U.S. Cl. .................................... 365/200; 365/125; 371/10.2
[58] Field of Search ............... 365/200, 185; 371/10.1, 371/10.2, 10.3

[56] References Cited

U.S. PATENT DOCUMENTS

| 3,715,735 | 2/1973 | Moss . | |
|---|---|---|---|
| 4,422,161 | 12/1983 | Kressel et al. | 365/200 |
| 4,451,903 | 5/1984 | Jordan . | |
| 4,566,102 | 1/1986 | Hefner | 365/200 |
| 4,584,681 | 4/1986 | Singh et al. | 371/10.1 |
| 4,630,241 | 12/1986 | Kobayashi et al. | 365/200 |
| 4,653,050 | 3/1987 | Vaillancourt | 365/200 |
| 4,672,581 | 6/1987 | Waller | 365/200 |
| 4,752,871 | 6/1988 | Sparks et al. | 365/185 |
| 4,757,474 | 7/1988 | Fukushi et al. | 371/10.2 |
| 4,773,046 | 9/1988 | Akaogi et al. | 371/10.3 |
| 4,819,205 | 4/1989 | McRoberts | 371/10.2 |
| 4,849,938 | 7/1989 | Furutani et al. | 371/10.3 |

FOREIGN PATENT DOCUMENTS

| 57-193066 | 11/1982 | Japan | 365/185 |
|---|---|---|---|
| 58-501564 | 9/1983 | Japan . | |
| 59-40392 | 3/1984 | Japan . | |
| 63-266697 | 11/1988 | Japan | 365/185 |

OTHER PUBLICATIONS

JEDEC publication No. 106, "Standard Manufacturer's Identification Code".
"Automatic Substitution of Faulty EPROM", IBM Technical Disclosure Bulletin, vol. 30, No. 6, (Nov. 1987), pp. 232–233.
IEEE International Solid-State Circuits Conference, Digest of Technical Papers, 1985, pp. 164–165, 333–335, Gaw et al.

Primary Examiner—Joseph E. Clawson, Jr.
Attorney, Agent, or Firm—Lowe, Price, LeBlanc and Becker

[57] ABSTRACT

A memory cell array (100) of an EPROM includes a first data memory region (1a), a second data memory region (1b), a 2M code memory line (2a) and a 1M code memory line (2b). When both the first and the second data memory regions (1a, 1b) are normal, the EPROM may be used as a 2M bit EPROM, in which case a device code indicating that the EPROM is a 2M bit EPROM is read out from the 2M code memory line (2a). When a defective portion is present in one of the first and the second data memory regions (1a, 1b), the EPROM may be used as a 1M bit EPROM, in which case a device code indicating that the EPROM is a 1M bit EPROM is read out from the 1M code memory line (2b).

21 Claims, 7 Drawing Sheets

5a: MOST SIGNIFICANT ADDRESS INPUT CIRCUIT

9: HIGH VOLTAGE INPUT DETECTING CIRCUIT
11: MEMORY LINE SWITCHING CIRCUIT

10: MOST SIGNIFICANT ADDRESS SWITCHING CIRCUIT

| FUSE a | FUSE b | A16 | ce | A | B | a16 | a16 | MODE |
|---|---|---|---|---|---|---|---|---|
| CONNECTED | CONNECTED | L | L | L | L | L | H | 2M MODE |
| — | CONNECTED | H | L | X | L | H | L | 2M MODE |
| CONNECTED | BLOWN | X | X | L | H | L | H | 1M MODE |
| BLOWN | BLOWN | X | X | H | H | H | L | 1M MODE |

| A9 | B | Xdis | SS1 | SS2 | MODE |
|---|---|---|---|---|---|
| 12V | L | H | L | H | 2M DEVICE DISCRIMINATING MODE |
| 12V | H | H | H | L | 1M DEVICE DISCRIMINATING MODE |
| H or L | X | L | L | L | — |

FIG.6
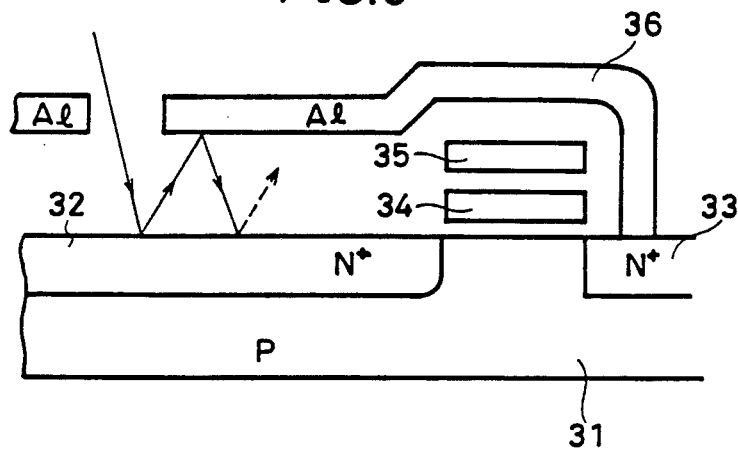
FIG.7
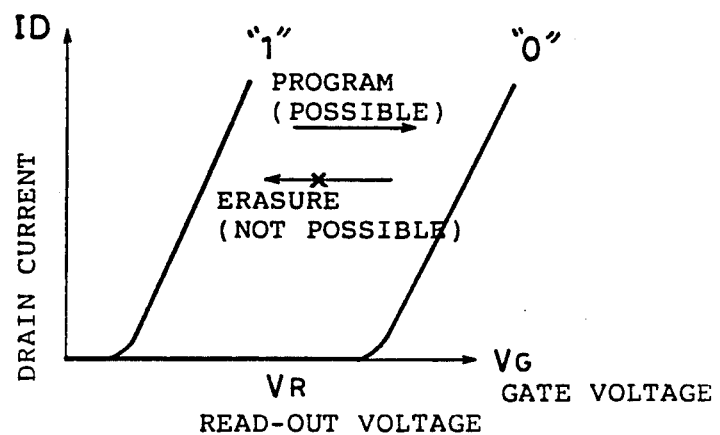
FIG.8
|  | C | D | UPROM | FUSE a | A |
|---|---|---|---|---|---|
| DURING ORDINARY USAGE (READ-OUT, PROGRAMMING etc.) | 0V | Vcc (5V) | ERASED | CONNECTED | L |
|  |  |  | PROGRAMMING STATE OR BLOWN |  | H |
| DURING PROGRAMMING INTO UPROM | VPP (12.5V) | VPP (12.5V) | — | — | — |

FIG. 9

| 2M | 1M | | | 1M | 2M |
|---|---|---|---|---|---|
| VPP | 1 | | 40 | VCC | |
| CE | 2 | | 39 | PGM | |
| D15 | 3 | | 38 | N.C | A16 |
| D14 | 4 | | 37 | A15 | |
| D13 | 5 | | 36 | A14 | |
| D12 | 6 | | 35 | A13 | |
| D11 | 7 | | 34 | A12 | |
| D10 | 8 | | 33 | A11 | |
| D9 | 9 | | 32 | A10 | |
| D8 | 10 | | 31 | A9 | |
| GND | 11 | | 30 | GND | |
| D7 | 12 | | 29 | A8 | |
| D6 | 13 | | 28 | A7 | |
| D5 | 14 | | 27 | A6 | |
| D4 | 15 | | 26 | A5 | |
| D3 | 16 | | 25 | A4 | |
| D2 | 17 | | 24 | A3 | |
| D1 | 18 | | 23 | A2 | |
| D0 | 19 | | 22 | A1 | |
| OE | 20 | | 21 | A0 | |

SEMICONDUCTOR MEMORY DEVICE HAVING MEANS FOR REPAIRING THE MEMORY DEVICE WITH RESPECT TO POSSIBLE DEFECTIVE MEMORY PORTIONS

This application is a continuation of application Ser. No. 07/354,596 filed May 22, 1989 now abandoned.

BACKGROUND OF THE INVENTION

1. Field of the Invention

This invention relates to a semiconductor memory device and, more particularly, to a semiconductor memory device including means for repairing the memory device with respect to possible defective memory portions.

2. Background of Art

FIG. 10 shows in a block diagram the structure of a conventional erasable and programmable read only memory (EPROM). As shown therein, a memory cell array 100 includes a data memory region 1 and a code memory line 2. As shown in FIG. 11, the memory cell array 100 includes a matrix of a plurality of word lines WL and a plurality of bit lines BL. A memory cell MC is provided at each intersection of the word and bit lines. In FIG. 10, the memory cell array 100 is divided into 16 memory cell blocks BK. A Y gate section 3 includes a plurality of Y gates corresponding to the memory cell array blocks BK. Similarly, a data input/output section 4 includes a plurality of data input/output circuits 40 corresponding to the memory cell array blocks BK.

An address input circuit 5 is supplied with address signals from outside. An X-decoder 6 is supplied with X address signals from the address input circuit 5 and a Y decoder 7 is supplied with Y address signals from the address input circuit 5. Responsive to the X address signals, the X decoder 6 selects one of the word lines WL in the memory cell array 100 and, responsive to the Y address signals, the Y decodes 7 selects one of the bit lines BL in each of the memory cell blocks BK. The Y gates 30 connect the bit lines BL selected in the corresponding memory cell array blocks BK to the corresponding data input/output circuits 40. Memory cells MC which is provided at the intersection of the selected word line WL and bit lines BL selected in this manner are selected.

During data read-out, data D0 to D15 are read out from the thus selected 16 memory cells MC via the Y gate section 3 and the data input/output section 4. Similarly, during data writing, the data D0 to D15 are written into the thus selected 16 memory cells MC via the data input/output section 4 and the Y gate section 3.

On the other hand, a control circuit 8 operates responsive to various control signals supplied from outside, such as $\overline{CE}$, $\overline{OE}$ or $\overline{PGM}$, to produce various timing signals to control the operation of various portions of the EPROM.

Each memory cell MC in the memory cell array 100 is comprised of the memory transistor such as one shown in FIG. 12. The memory transistor is comprised of N+ layers of a source 22 and a drain 23, formed on a P type semiconductor substrate 21, a floating gate 24 and a control gate 25.

During data programming, a source potential $V_{pp}$ of an electrical source for programming is applied to the control gate 25. The source potential $V_{pp}$ of the electrical source for programming is set to 12.5 V. At this time, the source 22 and the drain 23 are set to 0 V and about 8 V, respectively. During data read-out, a source potential $V_{cc}$ is applied to the control gate 25. At this time, the source 22 is at 0 V and the drain 23 is at about 1 V. The source potential $V_{cc}$ is usually set to 5 V.

FIG. 13 shows the relation between the drain current $I_D$ and the gate voltage $V_G$ of the control gate of the memory transistor. In this memory transistor, data "0" or "1" are stored, depending on whether or not electrons are stored in the floating gate 24 of the transistor. More in detail, when the electrons are stored in the floating gate 24 as a result of the programming operation, the threshold voltage of the memory transistor is raised. This causes a non-conductive state to be established between the source 22 and the drain 23 on application of a read-out voltage $V_R$ to the control gate 25. This state indicates that data "0" is stored in the memory transistor. Conversely, when the electrons are extracted from the floating gate 24 as a result of the erasure operation, the threshold voltage of the memory transistor is lowered. This causes a conductive state to be established between the source 22 and the drain 23 on application of a read-out voltage $V_R$ to the control gate 25. This state indicates that a data "1" is stored in the memory transistor.

Referring to FIG. 10, the manufacturer's code and the device codes are stored in the code memory line 2 of the memory cell array 100. These manufacturer's codes and the device codes are usually employed for automatic recognition of the programming setting conditions adopted in a programming apparatus adapted to program data in the EPROM. More in detail, since the data programming systems and the programming voltages differ from one manufacturer of the EPROM to another and from one device to another, the manufacturer's codes and the device codes may be advantageously employed to effect automatic setting required for programming by the programming apparatus.

The operation of reading out the manufacturer's codes and the device codes stored in the code memory line 2 will be explained. When a high potential of approximately 12 V is applied to an address input terminal adapted to be supplied with an address signal A9, a high voltage input detecting circuit 9 is activated. This causes the code memory line 2 adapted to store the manufacturer's code and the device code to be selected, while causing the non-selected state to be established in the X-decoder 6. As a result, the manufacturer's code or the device code stored in the memory cells constituting the code memory line 2 are outputted to the outside via the bit lines, Y gate section 3 and the data input/output section 4. When the address signal A0 is at a low (L) level, the EPROM's manufacturer's code is outputted and, when the address signal A0 is at a high (H) level, the device code of the particular EPROM is outputted.

It will be noted that flaws or defects may be caused in the memory cell array in the course of the manufacture process of the above described semiconductor memory device. For remedying the failure caused by these defects and thereby improving the yield, semiconductor memory device having redundancy circuits have become popular. However, with the recent increase in the capacity of the semiconductor memory device and the chip size, it is feared that there may be a certain limitation to the increase in the yield despite provision of the redundancy circuits.

In this view, there has been evolved a semiconductor memory device in which, when certain memory cell or cells are defective, the defective memory cell or cells are put out of use so that the memory device can be used as a memory device of a small memory capacity. The semiconductor memory device of this type is described for example in the Japanese Patent Laying-Open Gazette Nos. 40392/1984 and 501564/1983. The Japanese Patent Laying-Open Gazette No. 40392/1984 discloses a technique in which only one half area of the memory is used by fixing the address data to "1" or "0" to repair the defective memory chips. On the other hand, the Japanese Patent Laying-Open Gazette No. 501564/1983 discloses a technique in which one half memory area is used by designating an address code to repair to the defective memory chips.

Each of the prior art semiconductor memory devices can be used as a memory having one half the memory area when certain portions thereof are defective.

However, in the above described prior art semiconductor memory devices, the situation is that memory chips the total memory region of which can be used and the memory chips one half memory region of which can be used exist randomly on one and the same wafer. It would be difficult and lower the operating efficiency if, at the time of packaging of these memory chips, the memory chips need be checked as to whether the totality of the memory region or one half memory region thereof may be used in order to package them in the distinct packages.

Moreover, since the chip having the totality of the memory area usable and the chip having one half memory area usable present the same appearance, it is impossible to make automatic distinction between the chips the totality of the memory area of which is usable and the chips one half memory area of which is usable.

SUMMARY OF THE INVENTION

It is an object of the present invention to improve the yield of the semiconductor memory device.

It is another object of the present invention to provide an arrangement whereby, when a portion of the memory region of a semiconductor memory device is defective, the memory device may be used as a semiconductor memory device having a memory capacity lesser than its regular memory capacity, and whereby it can be determined electrically whether the semiconductor memory device can be used as the semiconductor memory device having the regular memory capacity or as the semiconductor memory device having a memory capacity lesser than the regular memory capacity.

It is a further object of the present invention to provide an operating method in a semiconductor memory device that can be used as a semiconductor memory device having a memory capacity lesser than the regular memory capacity in cases wherein a certain portion of the memory region is defective, whereby it can be determined electrically whether the memory device can be used as the semiconductor memory device having the regular memory capacity or as the semiconductor memory device having a memory capacity lesser than the regular memory capacity.

The semiconductor memory device according to the present invention includes a memory cell array comprised of a plurality of memory cells, first selection means and second selection means. The memory cell array includes a first data storage region, a second data storage region, a first discrimination code storage region and a second discrimination code storage region. The first discrimination code storage region stores a discrimination code indicating that both the first and the second storage regions are normal. The second discrimination code storage region stores a discrimination code indicating that one of the first and the second data storage regions is normal.

When both the first and the second data storage regions are normal, the first selection means are responsive to address signals supplied from outside for selecting any of a plurality of the memory cells in the first or second data storage regions. Similarly, when one of the first and the second data storage regions is normal, the first selection means are responsive to address signals supplied from outside for selecting any of a plurality of the memory cells in that one of the first and the second data storage regions that is normal.

The second selection means selects the first discrimination code storage region when both the first and the second data storage regions are normal, while selecting the second discrimination code storage region when one of the first and second data storage regions is normal.

In the semiconductor memory device of the present invention, if a defective portion or portions are present neither in the first data storage region nor in the second data storage region, both the first and second data storage regions of the memory cell array become usable. When a defective portion or portions are present in one of the first and second data storage regions, only the data storage region in which the defective portion or portions are not present become usable. That is to say, the semiconductor memory device of the present invention can be used as the semiconductor memory device having the regular memory capacity when a defective portion is not present in the memory cell array, while it can be used as a semiconductor memory device having a memory capacity lesser than the regular memory capacity when a defective portion is present in the memory cell array.

When the semiconductor memory device of the present invention may be used as the semiconductor memory device having the regular memory capacity, the discrimination code is read out from the first discrimination memory region. When the semiconductor memory device may be used as the semiconductor memory device having the memory capacity lesser than the regular memory capacity, the discrimination code is read out from the second discrimination memory region. In this manner, it can be electrically determined whether the semiconductor memory device can be used as the semiconductor memory device having the regular memory capacity or as the semiconductor memory device having a memory capacity lesser than the regular memory capacity.

BRIEF DESCRIPTION OF THE DRAWINGS

FIG. 6 is a sectional view of a UPROM.

FIG. 7 is a diagram showing the relation between the gate voltage and the drain current in the UPROM.

FIG. 8 is a diagram for illustrating the operation of the most significant address switching circuit of FIG. 5.

FIG. 9 is a diagram showing the pin disposition of the EPROM of FIG. 1.

DESCRIPTION OF THE PREFERRED EMBODIMENT

Figure 1:
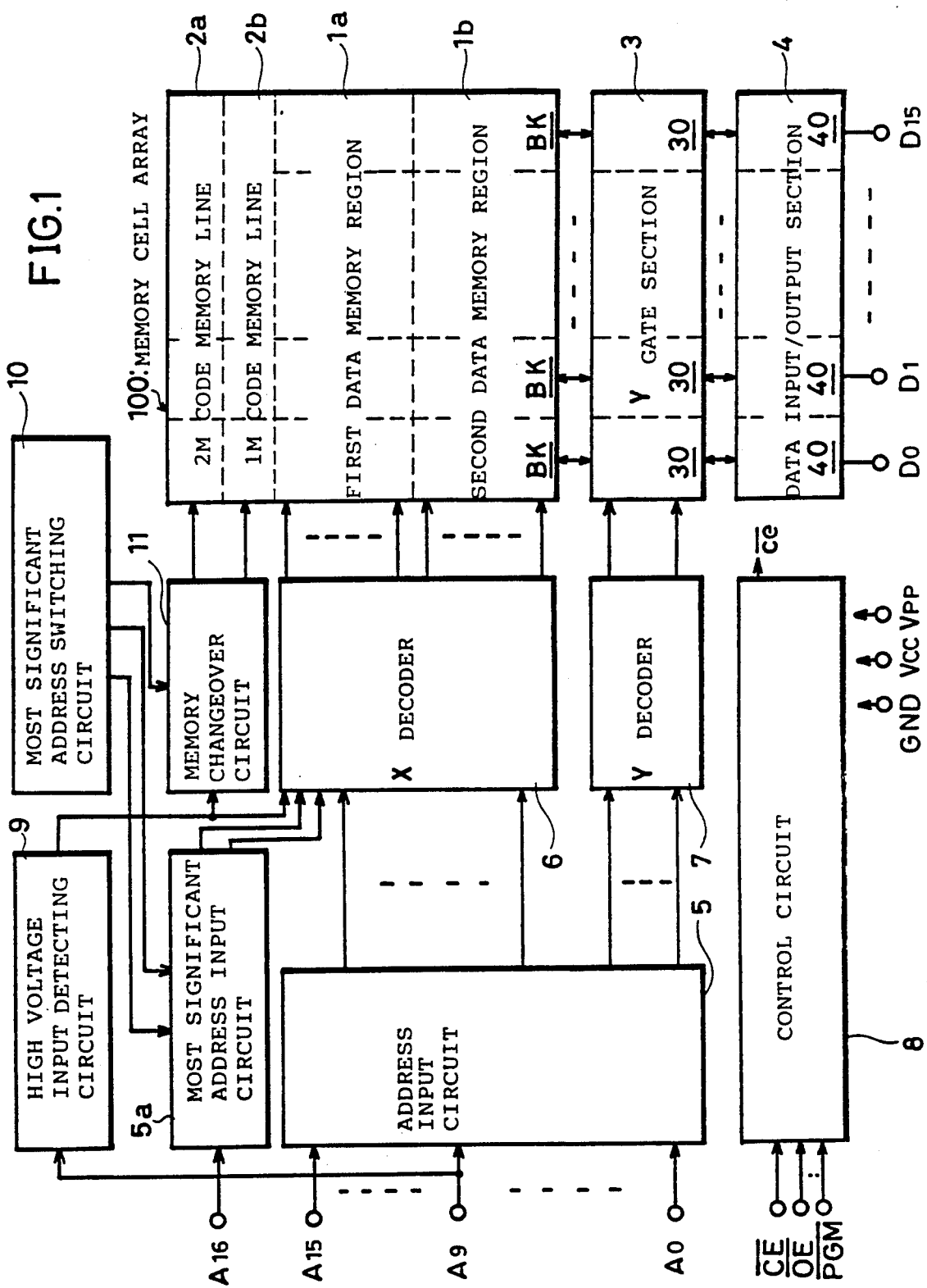
FIG. 1 is a block diagram showing the structure of an EPROM according to an embodiment of the present invention.

Referring to the drawings, a preferred embodiment of the present invention will be explained hereinbelow in detail.

Figure 11:
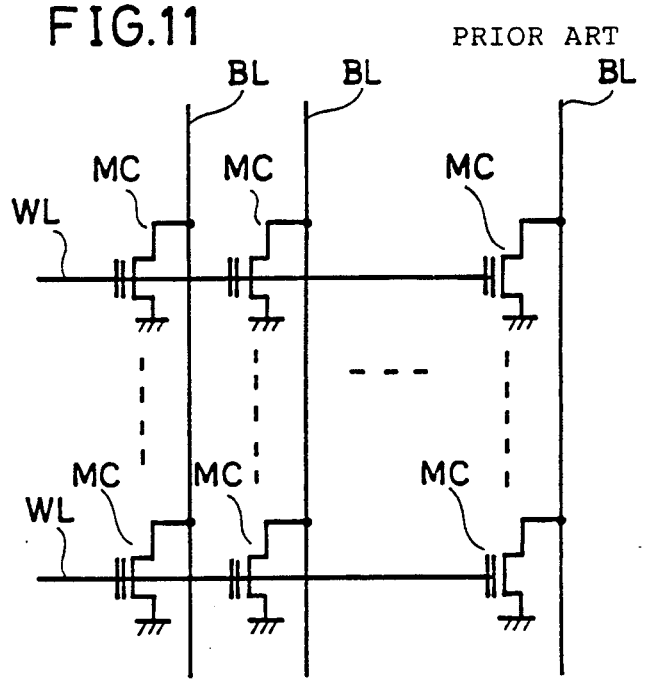
FIG. 11 is a circuit diagram showing the structure of a memory cell array in the EPROM shown in FIG. 10.
Figure 12:
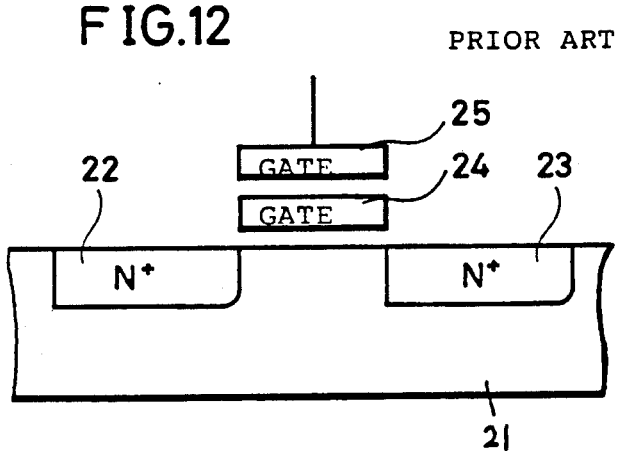
FIG. 12 is a sectional view of a memory transistor included in the memory cell array.
Figure 13:
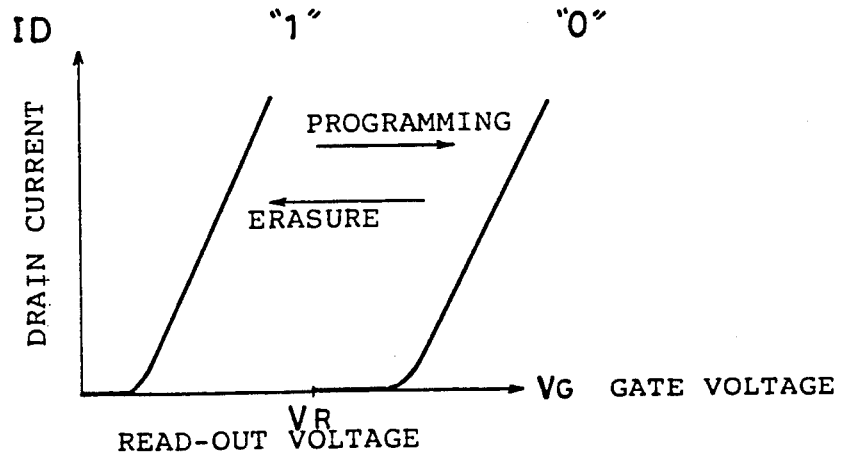
FIG. 13 is a diagram showing the relation between the gate voltage and the drain current in the memory transistor shown in FIG. 12.

FIG. 1 shows in a block diagram the structure of an EPROM according to an embodiment of the present invention. As shown therein, the EPROM includes, in addition to a memory cell array 100, a Y gate section 3, a data input/output section 4, an address input circuit 5, an X decoder 6, a Y decoder 7, a control circuit 8 and a high voltage input detecting circuit 9, a most significant address input circuit 9a, a most significant address switching circuit 10 and a memory line switching circuit 11. As shown in FIG. 11, the memory cell array 100 is comprised of a matrix of a plurality of word lines WL and a plurality of bit lines BL, with a memory cell MC being provided at each intersection of the word and bit lines WL and BL. Each memory cell MC is comprised of a memory transistor such as one shown in FIG. 12. Similarly to the EPROM shown in FIG. 10, the memory cell array 100 includes 16 memory cell array blocks BK. The Y gate section 3 includes a plurality of Y gates 30 corresponding to the memory cell array blocks BK. The data input/output section 4 includes a plurality of data input/output circuits 40 corresponding to the memory cell array blocks BK. The control circuit 8 is supplied with various control signals $\overline{CE}$, $\overline{OE}$ and $\overline{PGM}$ from outside.

The memory cell array 100 includes a first data memory region 1a, a second data memory region 1b, a 2M code memory line 2 and a 1M code memory line 2b. The X decoder 6 selects the first data memory area 1a and the second data memory area 1b when the most significant address signal A16 is "1" or at the high (H) level and when the signal A16 is "0" or at the low (L) level, respectively. The manufacturer's code and the device code are stored in each of the 2M code memory line 2a and the 1M code memory line 2b. When both the first and the second data memory regions 1a and 1b are normal, a device code indicating that this EPROM is used as a 2M bit EPROM is stored in the 2M code memory line 2a. When a defective portion exists in one of the first and the second data memory regions 1a and 1b, a device code indicating that the EPROM is used as a 1M bit EPROM is stored in the 1M code memory line 2b.

Figure 10:
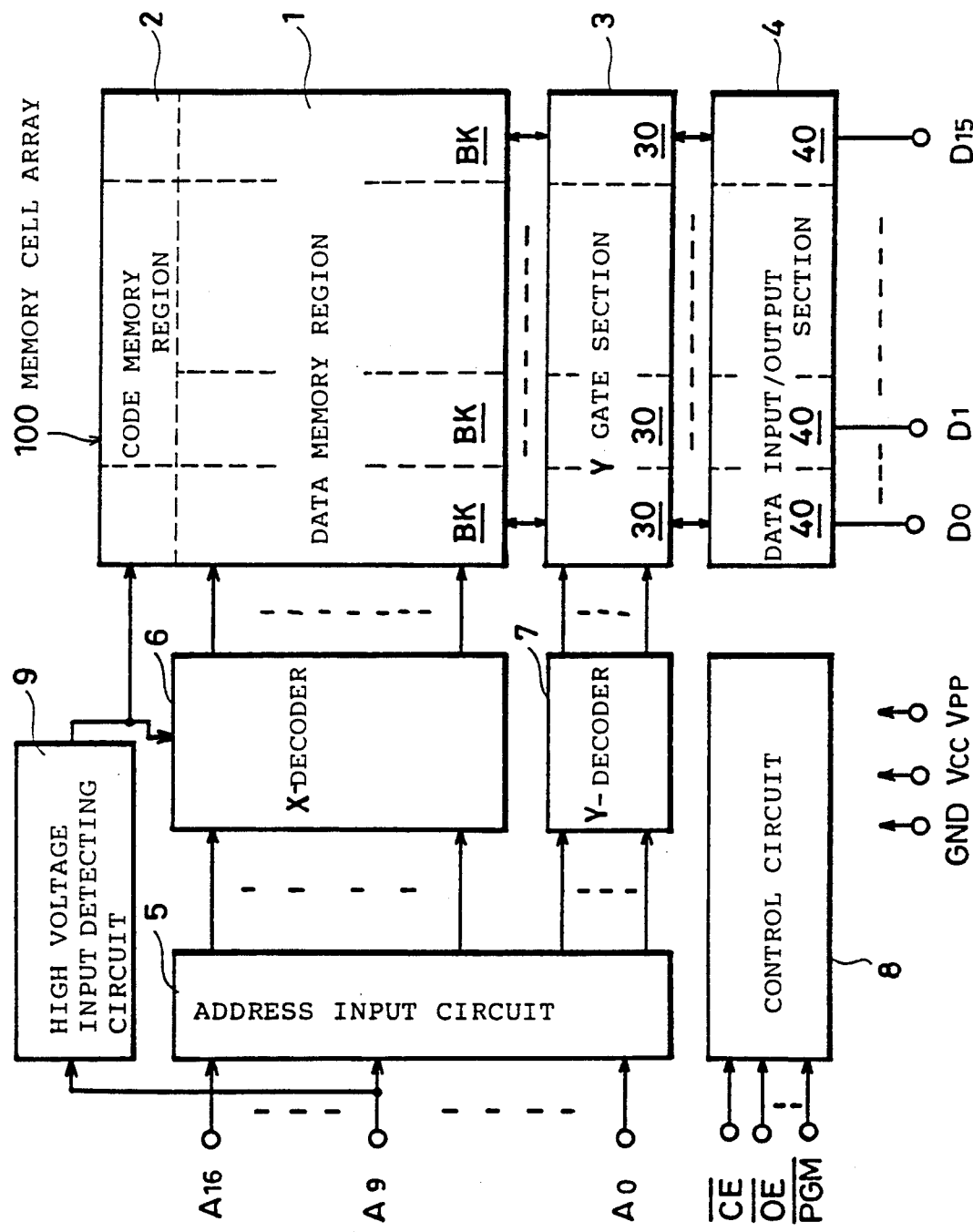
FIG. 10 is a block diagram showing the structure of a conventional EPROM.

The normal read-out and write operations of the EPROM shown in FIG. 1 are the same as those of the EPROM shown in FIG. 10. The operation proper to the EPROM of FIG. 1 is hereafter explained.

When a defective portion is present neither in the first data memory region 1a nor in the second data memory region 1b, the most significant address switching circuit 10 is set to a 2M mode. In this case, the EPROM is used as the 2M bit EPROM. When a high voltage of about 12 V is applied to an address input terminal adapted to receive an address signal A9, the high voltage input detecting circuit 9 is activated. This causes the memory line switching circuit 11 to select the 2M code memory line 2a, with the X decoder 6 being in the non-select state. When the address signal A0 is at the "L" level, the manufacturer's code stored in the 2M code memory line 2a is outputted to outside via the Y gate 3 and the data input/output section 4. When the address signal A0 is at the "H" level, the device code stored in the 2M code memory line 2a is outputted to the outside via the Y gate 3 and the data input/output section 4. It can be recognized from this device code that the EPROM can be used as the 2M bit EPROM.

It is now assumed that a defective portion is not present in the first data memory region 1a but is present in the second data memory region 1b. That is to say, it is assumed that this EPROM is acceptable when the most significant address signal A16 becomes "1" in the normal read-out and write operations. In this case, the most significant address switching circuit 10 is set to the 1M mode. This causes the EPROM to be used as the 1M bit EPROM. The most significant address input circuit 5a is responsive to the output of the most significant address switching circuit 10 for invalidating the most significant address signal A16 entered thereto to fix the address signal supplied to the X decoder 6 to "1". The memory line switching circuit 11 is switched responsive to the output of the most significant address switching circuit 10 from the state in which the 2M code memory line 2a can be selected to the state in which the 1M code memory line 2b can be selected.

It is noted that, when a high potential of about 12 V is applied to the address input terminal adapted to receive the address signal A9, the high voltage input detecting circuit 9 is activated. This causes the memory line switching circuit 11 to select the 1M code memory line 2b, with the X decoder 6 being in the non-select state. As a result, the manufacturer's code or the device code stored in the 1M code memory line 2b is outputted to the outside via the Y gate section 3 and the data input/output section 4. It may now be determined by this device code that this EPROM can be used as the 1M bit EPROM. In this case, the most significant address signal supplied to the X decoder 6 is fixed internally irrespective of the externally supplied address signal A16, such that the X decoder 6 can select only the first data memory region 1a but cannot select the second data memory 1b where the defective portion exists. Therefore, this EPROM can operate as an EPROM having a 1M bit memory capacity.

Conversely, when a defective portion exists in the first data memory region 1a, the most significant address signal, supplied from the most significant address input circuit 5a, is fixed at "0". Hence the X decoder 6 can select only the second data memory region 1b. The operation is otherwise the same as that when the detective portion exists in the second data memory region 1b.

Figure 2:
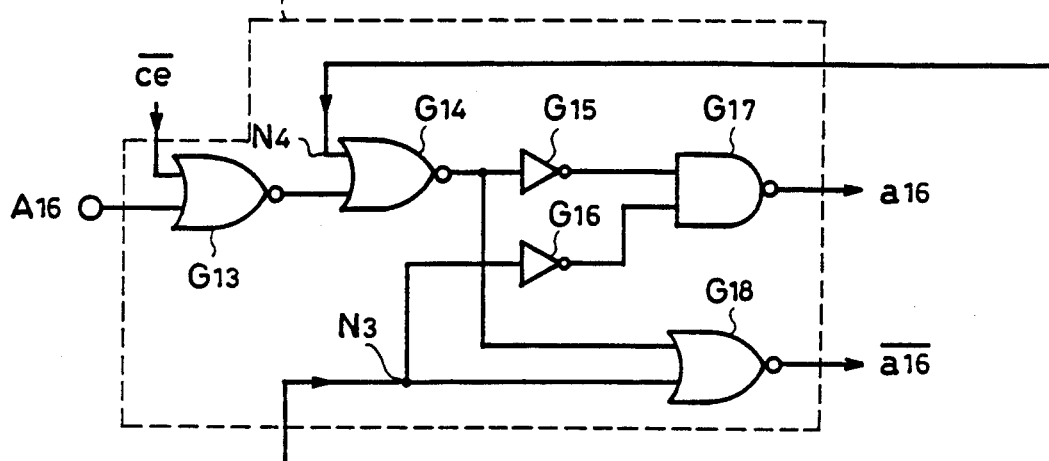
FIG. 2 is a circuit diagram showing the structure of a main portion of the EPROM shown in FIG. 1.
Figure 2:
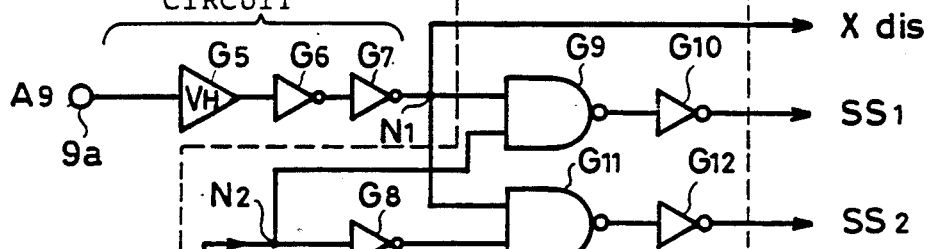
Figure 2:
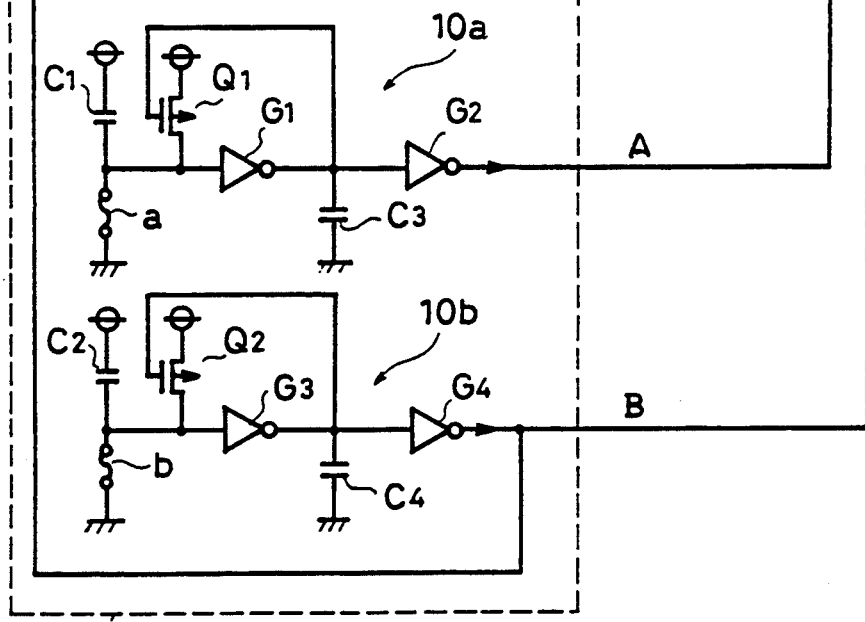

FIG. 2 is a circuit diagram showing the structure of the most significant address changeover circuit 10, a high voltage input detecting circuit 9, a memory line switching circuit 11 and a most significant input circuit 5a.

The most significant address switching circuit 10 is comprised of a first signal generator 10a and a second signal generator 10b. The first signal generator 10a includes inverters G1 and G2, a P-channel MOS transistor Q1, capacitors C1 and C3, and a fuse a. The second signal generator 10b includes inverters G3 and G4, a P-channel MOS transistor Q2, capacitors C2 and C4, and a fuse b. The fuses a and b are formed of, for example, polysilicon. When the fuse a is not blown out, the first output signal A from the inverter G2 is at the "L" level. When the fuse a is blown out by, for example, a laser trimming device, the first output signal A from the inverter G2 is at the "H" level. Similarly, when the fuse b is not blown out, the second output signal B from the inverter G4 is at the "L" level and, when the fuse b is blown out, the second output signal B from the inverter G4 is at the "H" level.

The high voltage input detecting circuit 9 includes a buffer G5 and inverters G6 and G7. When the ordinary "H" or "L" level address signal A9 is applied to the input terminal 9a, the output from the inverter G7 is at the "L" level. When a high voltage of 12 V is applied to the input terminal 9a, the output of the inverter G7 is at the "H" level.

The memory line switching circuit 11 includes inverters G8, G10 and G12 and NAND gates G9 and G11. The nodes N1 and N2 are supplied with the output of the high voltage input detecting circuit 9 and the second signal B from the most significant address switching circuit 10, respectively.

Figures 3, 4, 5:
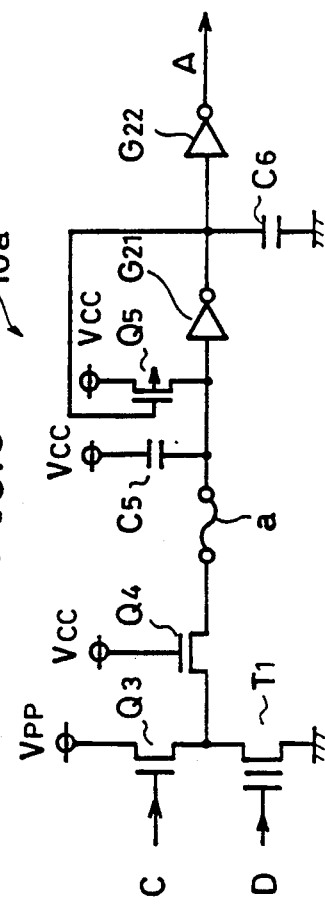
FIG. 3 is a diagram for illustrating the operation of a most significant address switching circuit.
FIG. 4 is a diagram for illustrating the operation of the circuit shown in FIG. 2.
FIG. 5 is a circuit diagram showing a modification of the most significant address switching circuit.

When a high voltage of 12 V is applied to an input terminal 9a of the voltage input detecting circuit 9, a "H" level control signal Xdis is outputted from node N1. The X decoder 6 shown in FIG. 1 is responsive to the "H" level control signal Xdis to be brought to the disabled state. When the second signal B outputted from the most significant address switching circuit 10 is at the "L" level, the memory line switching circuit 11 is in the 2M device discriminating mode, as shown in FIG. 4. In this case, the switching signal SS1 supplied from the inverter G10 is at the "L" level, while the switching signal SS2 outputted from the inverter G12 is at the "H" level. As a result, the 2M code memory line 2a shown in FIG. 1 is selected. Conversely, when the second signal B outputted from the most significant address switching circuit 10 is at the "H" level, the memory line switching circuit 11 is in the 1M device discriminating mode. In this case, the switching signal SS1 is at the "H" level, while the switching signal SS2 is at the "L" level. As a result, the 1M code memory line 2b shown in FIG. 1 is selected.

When the ordinary "H" level or "L" level address signal A9 is supplied to the input terminal 9a of the high voltage input detecting circuit 9, a "L" level control signal Xdis is supplied from the node N1. This causes the decoder 6 to be enabled. In this case, as shown in FIG. 4, the switching signals SS1 and SS2 are at the "L" level, no matter what is the level of the second signal B. The result is that neither the 2M code memory line 2a nor the 1M code memory line 2b shown in FIG. 1 is selected.

The most significant address input circuit 5a includes NOR gates G13, G14 and G18, inverters G15 and G16, and a NAND gate G17. One input terminal of the NOR gate G13 is supplied with a chip enable signal $\overline{ce}$ from the control circuit 8, while the other input terminal thereof is supplied with the most significant address signal A16. The nodes N3 and N4 are supplied with the first signal A from the most significant address switching circuit 10 and the second signal B from the most significant address switching circuit 10, respectively. When the second signal B is at the "L" level, as shown in FIG. 3, the most significant address input circuit 5a is set to the 2M mode. When the most significant address signal A16 is at the "L" level, with the chip enable signal $\overline{ce}$ and the first signal A being at the "L" level, the address signal a16 supplied from the NAND gate G17 is at the "L" level, while the address signal $\overline{a16}$ supplied from the NOR gate G18 is at the "H" level. Thus, the second data memory region 1b is selected. When the most significant address signal a16 is at the "H" level, with the chip enable signal $\overline{ce}$ being at the "L" level, the address signal a16 is at the "H" level, while the address signal $\overline{a16}$ is at the "L" level. Thus, the first data memory region 1a is selected.

On the other hand, when the second signal B is at the "H" level, the most significant address input circuit 5a is set to the 1M mode. With the first signal A at the "L" level, the address signals a16 and $\overline{a16}$ are at the "L" and "H" levels, respectively, no matter what are the levels of the most significant address signal A16 and the chip enable signal $\overline{ce}$. Thus, the second data memory region 1b is selected, no matter what is the level of the most significant address signal A16 supplied from outside. Conversely, with the first signal A at the "H" level, the address signals a16 and $\overline{a16}$ are at the "H" level and "L" level, respectively, no matter what are the levels of the most significant address signal A16 and the chip enable signal $\overline{ce}$. Thus, the first data memory region 1a is selected, no matter what is the level of the most significant address signal A16 supplied from outside.

When the fuse b in the most significant address switching circuit 10 is in the connected state, the most significant address input circuit 5a is set to the 2M mode, as shown in FIG. 3. In this case, the EPROM can be used as the 2M bit EPROM, such that, responsive to the address signals A0 to A16, the memory cells in the first data memory region 1a or in the second data memory region 1b are selected. When the fuse b in the most significant switching circuit 10 is blown out the most significant address input circuit 5a is set to the 1M mode. In such case, the EPROM can be used as the 1M bit EPROM. When the fuse a is connected, the second data memory region 1b is used. Similarly, when the fuse a is blown out, the first data memory region 1a is used.

It will be seen that when a defective portion exists in the memory cell array of the above described EPROM, it can be operated correctly as the 1M bit EPROM.

Also, by reading out the device code from the 2M code memory line 2a or the 1M code memory line 2b, it can be determined electrically whether the EPROM can be used as the 2M bit EPROM or as the 1M bit EPROM.

FIG. 5 is a circuit diagram showing a modification of the most significant address switching circuit 10. FIG. 5 shows the first signal generator 10a for producing the first signal A. The structure of the second signal generator 10b for generating the second signal B is same as that of the circuit 10a.

The signal generator shown in FIG. 5 includes an unerasable PROM (UPROM) T1 and P-channel MOS transistors Q3 and Q4 in addition to inverters G21 and G22, a P-channel MOS transistor Q5, capacitors C5 and C6 and a fuse a.

FIG. 6 shows the UPROM in cross-section. This UPROM includes N+ layers of a source 32 and a drain 33, formed on a P-type semiconductor substrate 31, a floating gate 34, a control gate 35 and an aluminum layer 36. Thus the UPROM has a structure in which memory cells of an EPROM are covered by the A layer. Therefore, the UV rays irradiated from outside does not reach the floating gate 34. Thus, as shown in FIG. 7, the data written in the UPROM can no longer be erased.

The information concerning the UPROM may be found in IEEE International Solid-State Circuits Conference, Digest of Technical Papers, 1985, pages 164 to 165 and 333 to 335.

During the normal usage of the signal generator shown in FIG. 5, the control signal C is set to 0 V, while the control signal D is set to the supply potential $V_{cc}$ of 5 V, as shown in FIG. 8. With the UPROM T1 in the erased state and the fuse a in the connected state, the first signal A is at the "L" level. With the UPROM T1 in the program state or the fuse a in the blown state, the first signal A is at the "H" level. That is, the first signal A is at the "H" level when the data are programmed into the UPROM T1 or the fuse a is blown out. It is noted that, when the data are written into the UPROM T1, the control signals C and D are set to the high voltage $V_{pp}$ of 12.5 V.

FIG. 9 shows the pin disposition of a package fitted with the EPROM of FIG. 1. FIG. 9 shows a 40-pin type semiconductor memory device that can be used as the 2M bit EPROM and as the 1M bit EPROM. As shown therein, when the semiconductor memory device is used as the 1M bit EPROM, the 38th terminal becomes the no-connection (NC) terminal. Similarly, when the semiconductor memory device is used as the 2M bit EPROM, the 38th terminal becomes the terminal to which the most significant address signal is entered. Even when this semiconductor memory device is defective as the 2M bit EPROM, the memory device may be operated as the 1M bit EPROM, on the condition that it may be operated with the most significant address signal A16 of "1" or "0". In this case, the 38th terminal serves as the NC terminal, while the externally supplied most significant address signal A16 is invalidated, with the address signal being internally fixed to "1" or "0".

It is noted that the fuses a and b in the most significant address switching circuit 10 or the UPROM T1 may be substituted by other electrical fuses or the like.

It is also noted that the present invention is applied in the above embodiment to the EPROM, it may also be applied to an electrically erasable and programmable read only memory (EEPROM) or to other semiconductor memories.

POST DISCLOSURE SUMMARY

From the foregoing it is seen that the present invention provides a semiconductor memory device which can be used as the semiconductor memory device having a lesser capacity than its regular memory capacity when a defective portion exists in the memory region of the semiconductor memory device, and that it can be determined electrically whether the memory device can be used as the memory device having its regular memory capacity or as the memory device having a memory capacity lesser than its regular memory capacity. In this manner, the yield of the semiconductor memory device may be improved, while the prime cost of the memory device may be lowered.

What is claimed is:

1. A semiconductor memory device, comprising:

a memory cell array including a first data storage region, a second data storage region, a first discrimination code storage region and a second discrimination code storage region, each of said regions including a plurality of memory cells, said first discrimination code storage region for storing a discrimination code indicating that both said first and second data storage regions are normal, said second discrimination code storage region storing a discriminating code indicating that one of said first and second data storage regions is normal, first selection means responsive to externally applied address signals for selecting any of the memory cells in said first or second data storage regions when both said first and second data storage regions are normal, and responsive to externally applied address signals for selecting, when only one of the first and second data storage regions is normal, any of the memory cells only in the normal one of said first and second data storage regions, and second selection means for selecting and reading out externally from said memory device
   (i) said first discrimination code when both said first and second data storage regions are normal, and
   (ii) said second discrimination code when only one of said first and second data storage regions is normal.

2. The semiconductor memory device according to claim 1, wherein said externally applied address signals include region selection signal for selecting one of the first and the second data storage regions (1a, 1b), the semiconductor memory device further comprising region selection signal input means (5a) receiving said region selection signal of said externally applied address signals and for applying said region selection signals to said first selection means (6) when both said first and second data storage regions (1a, 1b) are normal and for applying the region selection signal for selecting, when one of said first and second data storage regions (1a, 1b) is normal, the normal one of the data storage regions, and signal input detection means responsive to externally applied code selection signal for disabling said first selection means (6) while enabling said second selection means (11).

3. The semiconductor memory device according to claim 2, which further comprises setting means (10) presettable to produce a first signal when said first data storage region (1a) is normal and to produce a second signal when said second data storage region (1b) is normal, said setting means being also presettable to produce a third signal when both said first and second data storage regions (1a, 1b) are normal, and wherein, said region selection input means (5a) supplies a first region selection signal for selecting said first data storage region (1a) to said first selection means (6) in response to said first signal, supplies a second region selection signal for selecting said second data storage region (1b) to said first selection means (6) in response to said second signal, and supplies the region selection signal of said externally applied address signals to said first selection means (6) in response to said third signal, said second selection means (11) selects said second discrimination code storage region (2b) in response to said first or second signal, and selects said first discrimination code storage region (2a) in response to said third signal.

4. The semiconductor memory device according to claim 2, which further comprises an address signal input terminal (9a) supplied with said externally applied address signal, and wherein said code selection signal is a signal of a higher level than the normal logic level, said signal input detecting means is responsive to said higher level signal being applied to said address signal input terminal (9a) to produce a disable signal, said first selection means (6) is disabled in response to said disable signal, said second selection means (11) is enabled in response to said disable signal.

5. The semiconductor memory device according to claim 3, wherein said setting means (10) includes at least one fuse element (a, b), said setting means producing said first, second and third signals depending on whether said fuse elements (a, b) are blown out.

6. The semiconductor memory device according to claim 3, wherein said setting means (10) includes at least one fuse element (a) and at least one unerasable programmable ROM (T1), said setting means producing said first, second or third signals depending on whether said fuse element (a) blown or whether said unerasable programmable ROM (T1) is in the program state or erasure state.

7. The semiconductor memory device according to claim 3, wherein said setting means (10) includes first and second signal generating means (10a, 10b), each including fuse elements (a, b) and producing a first logical level signal when said fuse elements (a, b) are blown out and a second logical level signal when said fuse elements (a, b) are not blown out, said first signal comprises a predetermined combination of said first or second logical level signals from said first and second signal generating means (10a, 10b)

said second signal comprises another predetermined combination of said first or second logical level signals from said first and second signal generating means (10a, 10b), and said third signal comprises still another predetermined combination of said first or second logical level signals from said first and second signal generating means (10a, 10b).

8. The semiconductor memory device according to claim 7, wherein each of said first and second signal generating means (10a, 10b) further includes an unerasable programmable ROM T1 and outputs said first logical level signal when said unerasable programmable ROM (T1) is in the program state or when said fuse elements (a, b) are blown out.

9. The semiconductor memory device according to claim 7, wherein said region selection means includes logical processing means (5a), said logical processing means receiving said first or second logical level signal from said first and second signal generating means (10a, 10b) and said region selection signals of said externally applied address signals, and being responsive to said predetermined combination of said first or second logical level signals from said first and second signal generating means (10a, 10b) for outputting said first region selection signal, said logical processing means being responsive to said another predetermined combination of said first or second logical level signal from said first and second signal generating means (10a, 10b) for outputting said second region selection signals, said logical processing means being responsive to said still another predetermined combination of said first or second logical level signal from said first and second signal generating means (10a, 10b) for outputting said externally supplied region selection signals.

10. The semiconductor memory device according to claim 7, wherein said second selection means includes logical processing means (11) responsive to a predetermined combination of said first or second logical level signal from said first or second signal generating means (10a, 10b) and the disable signal from said signal input detecting means (9) for outputting a first selection signal for selecting said first discrimination code storage region (2a), said logical processing means being responsive to another predetermined combination of said first or second logical level signal from said first or second signal generating means (10a, 10b) and said disable signal from said signal input detecting means (9) for outputting a second selection signal for selecting said second discrimination code storage region (2b).

11. The semiconductor memory device according to claim 4, wherein said signal input detecting means includes logical processing means (9) responsive to said high level signal for outputting a disable signal of a predetermined logical level.

12. The semiconductor memory device according to claim 1, wherein each of said memory cell comprises an EPROM.

13. The semiconductor memory device according to claim 1, wherein said plurality of memory cells in said memory cell array (100) are arranged in a matrix of a plurality of rows and a plurality of columns, said first data storage region (1a), the second data storage region (1b), the first discrimination code storage region (2a) and the second discrimination code storage region (2b) each comprise at least one row of memory cells, said first selection means comprises a row decoder 6, said semiconductor memory device further comprising a column decoder (7) for selecting one of said plurality of columns in said memory cell array (100).

14. A method for operating a semiconductor memory device comprising a memory cell array including a first data storage region, a second data storage region, a first discrimination code storage region and a second discrimination code storage region, each said regions including a plurality of memory cells, said method comprising the steps of:

storing in said first discrimination code storage regions a discrimination code indicating that both said first and second data storage regions are normal;

storing in said second discrimination code storage region a discriminating code indicating that one of said first and second data storage regions is normal;

selecting, responsive to externally supplied address signals, any of the memory cells in said first or second data storage region when both said first and second data storage regions are normal;

selecting, when one of said first and second data storage regions is normal, any of the memory cells in the normal one of said first and second data storage regions, in response to externally supplied address signals, and selecting said first discrimination code storage region when both said first and second data storage regions are normal, and selecting said second discrimination code storage region when one of said first and second data storage regions is normal, and reading out externally from said memory device discrimination data from said selected one of said discrimination code storage regions.

15. A semiconductor memory device comprising:
a memory cell array including a first data storage region, a second data storage region, a first discrimination code storage region and a second discrimination code storage region, each of said regions including a plurality of memory cells, said first discrimination code storage region for storing a discrimination code indicating that both said first and second data storage regions are functional and said second discrimination code storage region being provided for storing a discrimination code indicating that only one of the two data storage regions is functional, first selection means responsive to externally applied address signals and responsive to region selection signals indicating an operational state of said data storage regions for selecting corresponding ones of the memory cells (MC) in both data storage regions if both said first and second data storage regions are functional, and selecting corresponding ones of the memory cells (MC) only in a functional region of said data storage regions if only one of the two data storage regions is functional, and second selection means responsive to an externally applied code selection signal and responsive to said region selection signals for selecting and reading out externally from said memory device,
   (i) said first discrimination code storage region if both said first and second data storage regions are functional, and
   (ii) said second discrimination code storage region if only one of the two data storage regions is functional.

16. A semiconductor memory device according to claim 15 further comprising:
data storage region selection means (5a) receiving a signal representing a most significant address (A16) of the externally applied address signals (A0–A16)-, and supplying said region selection signals to said first selection means in response to status signals indicating the state of respective ones of said data storage regions (1a, 1b), said data storage region selection means applying said region selection signals to said first selection means (6), and signal input detection means (9) supplying a discrimination code enable signal for selectively disabling said first selection means (6) and for enabling said second selection means (11) responsive to said externally applied code selection signal (A9).

17. A semiconductor memory device programmable to indicate a reduced memory configuration, comprising:
a memory cell array including four distinct memory regions including first and second data storage regions and first and second discrimination code storage regions, each of said regions including a plurality of memory cells, memory cells of said first and second discrimination code storage regions comprising nonvolatile memory cells, said first discriminating code storage region storing a discrimination code indicating a memory storage capability of said memory cell array wherein both said first and second data storage regions are operable, said second discrimination code storage region storing a discriminating code indicating a reduced memory configuration whereby only one of said first and second data storage regions is operable;

address signal input means for receiving an externally supplied address signal;

signal level detecting means for detecting a level of said externally supplied address signal and, in response to detecting a predetermined high signal level, supplying a selection means enable signal;

first selection means responsive to said selection means enable signal and to externally applied address signal for selecting any of the memory cells in said first or second data storage regions if both said first and second data storage regions are operable, and responsive to externally applied signal for selecting, if only one of the first and second storage regions is operable, any of the memory cells in the operable one of said first and second data storage regions whereby said first selection means is enabled in response to said signal level detecting means detecting a level of said externally supplied address signal below said predetermined high signal level; and second selections means responsive to said selection means enable signal for selecting and reading out externally from said memory device
   (i) said first discrimination code storage region if both said first and second data storage regions are operable, and
   (ii) said second discrimination region if only one of said first and second data storage regions is operable, whereby said second selection means is enabled in response to said signal level detecting means detecting a level of said externally supplied address signal equal to or greater than said predetermined high signal level.

18. A method for operating a semiconductor memory device comprising a memory cell array including a first data storage region, a second data storage region, a first discrimination code storage region and a second discrimination code storage region, each said regions including a plurality of memory cells, said method comprising the steps of:
storing in said first discrimination code storage means a discrimination code indicating that both said first second data storage regions are normal;

storing in said second discrimination code storage region a discriminating code indicating that one of said first and second data storage regions is normal;

selecting, responsive to externally supplied address signals, any of the memory cells in said first or second data storage region if both said first and second data storage regions are normal;

selecting, if one of said first and second data storage regions is normal, any of the memory cells in the normal one of said first and second data storage regions, in response to externally supplied address signals;

selecting said first discrimination code storage region if both said first and second data storage regions are normal, and selecting said second discrimination code storage region if one of said first and second data storage regions is normal;

detecting a signal level of said externally applied address signal; and selectively supplying externally from said memory device data stored in either
(i) said first and second data storage regions of said selected memory cells, or
(ii) a selected one of said first and second data storage regions in response to said signal level detection step.

19. A semiconductor memory device, comprising:
a memory cell array including a first data storage region and a second data storage region,
a first discrimination code storage region and a second discrimination code storage region,
each of said data and code storage regions including a plurality of memory cells,
said first discrimination code storage region for storing a discrimination code indicating that both said first and second data storage regions are normal,
said second discrimination code storage region storing a discriminating code indicating that only one of said first and second data storage regions is normal,
first selection means responsive to externally applied address signals for selecting any of the memory cells in said first or second data storage regions when both said first and second data storage regions are normal, and responsive to externally applied address signals for selecting, when only one of the first and second data storage regions is normal, any of the memory cells in only the normal one of said first and second data storage regions, and
second selection means for selecting and reading out externally
(i) said first discrimination code when both said first and second data storage regions are normal, and
(ii) said second discrimination code when only one of said first and second data storage regions is normal.

20. A semiconductor memory device, comprising:
a memory cell array including a first data storage region and a second data storage region,
a discrimination code storage region storing a discrimination code specifying that both said first and second data storage regions are normal or that only one of said first and second data storage regions is normal,
each of said data storage regions including a plurality of memory cells,
selection mans responsive to externally applied address signals for selecting any of the memory cells in said first or second data storage regions when both said first and second data storage regions are normal, and responsive to externally applied address signals for selecting, when only one of the first and second data storage regions is normal, any of the memory cells in only the normal one of said first and second data storage regions, and
means for reading out externally said discrimination code.

21. A semiconductor memory device, comprising:
a memory cell array including a first data storage region, a second data storage region and a discrimination code storage region,
each of said data and code storage regions including a plurality of memory cells,
said discrimination code storage region storing a discrimination code specifying that both said first and second data storage regions are normal or that only one of said first and second data storage regions is normal,
selection means responsive to externally applied address signals for selecting any of the memory cells in said first or second data storage regions when both said first and second data storage regions are normal, and responsive to externally applied address signals for selecting, when only one of the first and second data storage regions is normal, any of the memory cells in only the normal one of said first and second data storage regions, and
means for reading out externally said discrimination code.

* * * * *